(12) United States Patent
Joo (10) Patent No.: US 7,507,623 B2
(45) Date of Patent: Mar. 24, 2009

(54) FABRICATING METHOD OF SEMICONDUCTOR DEVICE

(75) Inventor: Kim Jung Joo, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/976,579

(22) Filed: Oct. 25, 2007

(65) Prior Publication Data

US 2008/0057661 A1 Mar. 6, 2008

Related U.S. Application Data

(62) Division of application No. 11/320,823, filed on Dec. 30, 2005, now Pat. No. 7,306,989.

(30) Foreign Application Priority Data

Dec. 31, 2004 (KR) .................. 10-2004-0117827

(51) Int. Cl.
*H01L 21/8249* (2006.01)
(52) U.S. Cl. ................. 438/253; 438/258; 438/593; 438/257; 438/E21.145
(58) Field of Classification Search ......... 438/257–258, 438/593, 243–244, 396–387, 253–254
See application file for complete search history.

(56) References Cited

U.S. PATENT DOCUMENTS

2005/0221539 A1* 10/2005 Kim et al. ................. 438/132
2006/0194348 A1* 8/2006 Araujo et al. ............... 438/3

FOREIGN PATENT DOCUMENTS

JP 2001-320026 * 11/2001

OTHER PUBLICATIONS

Office Action from the Korean Intellectual Property Office dated May 16, 2006, in counterpart Korean Application No. 10-2004-0117827.

* cited by examiner

*Primary Examiner*—Dung A. Le
(74) *Attorney, Agent, or Firm*—Finnegan, Henderson, Farabow, Garrett & Dunner, L.L.P.

(57) ABSTRACT

A fabricating method of a semiconductor device includes: forming a first metal layer on a substrate and patterning the first metal layer to form a bottom metal line and a bottom electrode of a capacitor; forming an interlayer insulating layer on the resulting structure; forming a via hole in the interlayer insulating layer and forming a contact; etching the interlayer insulating layer to form a trench exposing the bottom electrode; forming a dielectric layer on the resulting structure, and removing the dielectric layer formed outside the trench; and forming a second metal layer on the resulting structure to form a top metal line and a top electrode of the capacitor.

6 Claims, 10 Drawing Sheets

FABRICATING METHOD OF SEMICONDUCTOR DEVICE

This is a division of application Ser. No. 11/320,823, filed Dec. 30, 2005, now U.S. Pat. No. 7,306,989, which is incorporated herein by reference. application Ser. No. 11/320,823 claims the benefit of priority under 35 U.S.C. § 119 to Korean Patent Application No. 10-2004-0117827, filed on Dec. 31, 2004.

BACKGROUND OF THE INVENTION

1. Field of the Invention

The present invention relates to a fabricating method of a semiconductor device.

2. Description of the Related Art

Figure 1A:
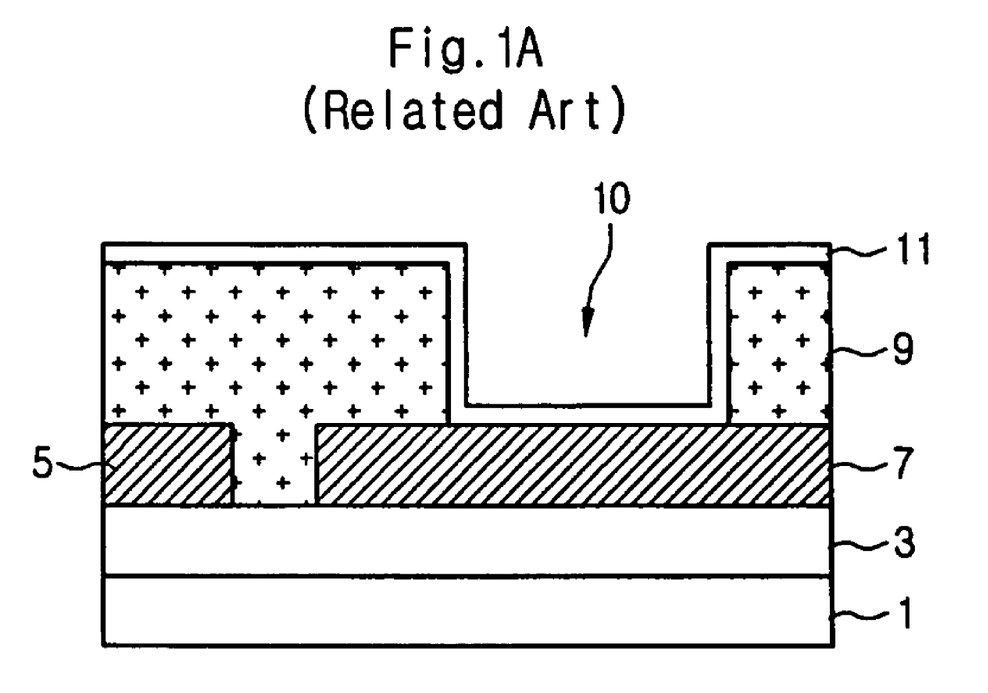
FIGS. 1A to 1C are sectional views illustrating a related art method of forming an MIM capacitor.
Figure 1B:
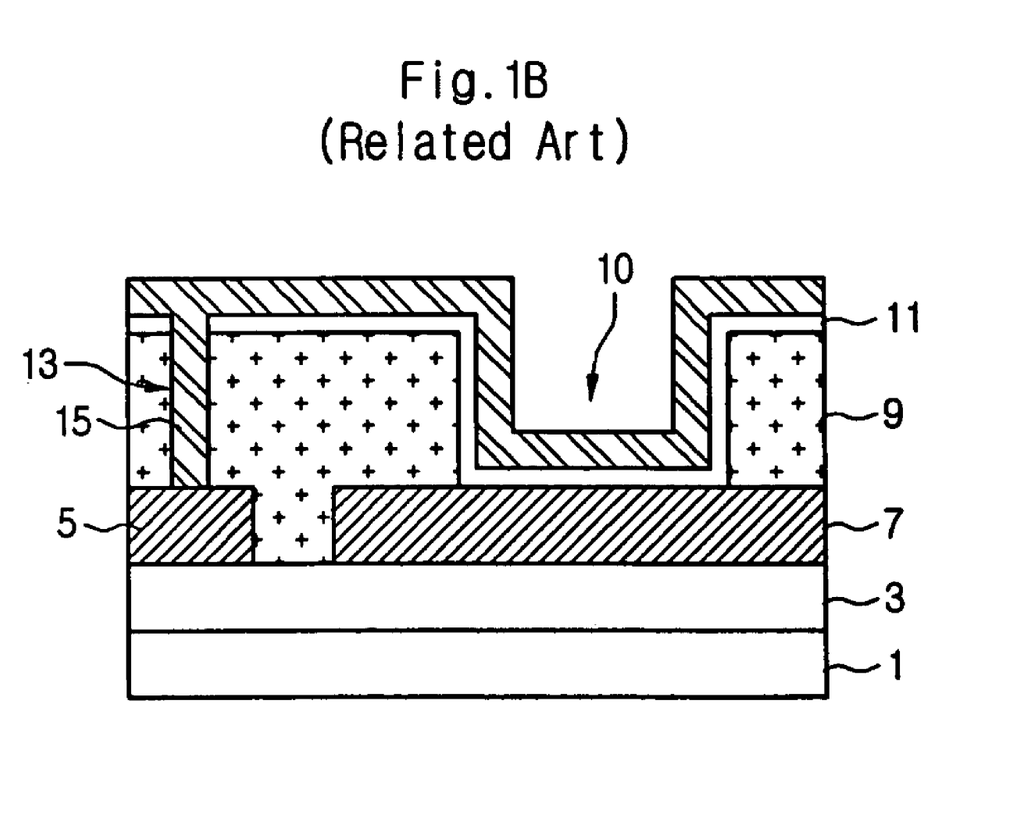
Figure 1C:
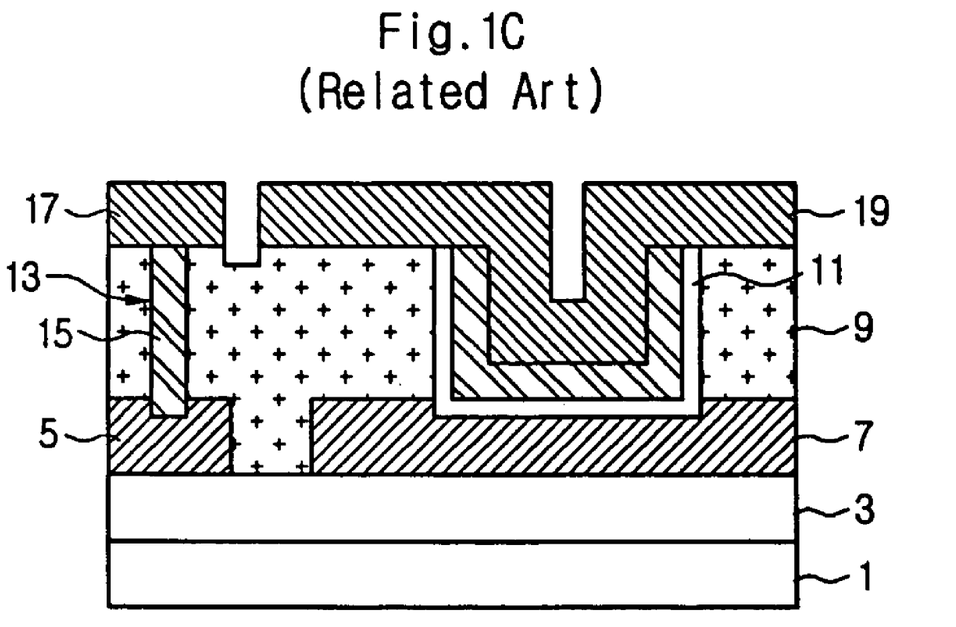

A related art trench type metal-insulator-metal (MIM) capacitor is formed by fabricating method of semiconductor device illustrated in FIGS. 1A to 1C. FIGS. 1A to 1C are sectional views illustrating a related art method of forming a trench type metal-insulator-metal (MIM) capacitor.

Referring to FIG. 1A, an oxide layer 3 is formed on a predetermined substrate 1. Then, a metal layer is formed on the oxide layer 3 and is patterned to form a bottom metal line 5 and a bottom electrode 7 of a capacitor. The bottom metal line 5 and the bottom electrode 7 can be formed of aluminum (Al) having good conductivity.

Next, an interlayer insulating layer 9 is formed on the resulting structure, and a trench 10 is formed according to a capacitor structure. A dielectric layer 11 is then formed on the resulting structure.

Referring to FIG. 1B, a via hole 13 is formed. A contact 15 connecting to the bottom metal line 5 is formed by depositing tungsten (W) using a chemical vapor deposition (CVD) process.

Referring to FIG. 1C, all tungsten layer except the inside of the via hole 13 and the inside of the trench 10 is removed using a chemical mechanical polishing (CMP) process. An aluminum (Al) layer is deposited on the resulting structure and is patterned to form a top metal line 17 and a top electrode 19 of the capacitor.

Meanwhile, as the integration density of the semiconductor device is increasing, many attempts have been made to increase the capacitance of the capacitor using a dielectric layer with large dielectric constant. Silicon nitride (SiN) with a relatively large dielectric constant has been widely used as the dielectric layer of the MIM capacitor.

In summary, the related art fabricating method of the semiconductor device includes forming the trench according to the MIM capacitor structure, forming the silicon nitride (SiN) layer as the dielectric layer, and forming the via hole. However, such a related art fabricating method of the semiconductor device has the following problems.

First, an amine component of a deep ultraviolet (DUV) photoresist used in an exposure process when forming the via hole reacts with nitrogen of the silicon, nitride (SiN) layer, thus forming polymer. The polymer may remain on the surface of the silicon nitride (SiN) layer after the patterning process. Also, the polymer is difficult to remove. The polymer remaining on the surface of the silicon nitride (SiN) layer weakens the adhesion between tungsten and silicon nitride (SiN).

In addition, the tungsten (W) CVD has a high compressive characteristic. Therefore, when tungsten (W) is deposited in a relatively wide area, a tungsten (W) peeling phenomenon may occur. Since the trench region for the MIM capacitor has 100-1000 times the size of the via hole, it exists in a relatively wide area. A stress control of the tungsten is very important. However, it is very difficult to control the stress of the tungsten.

Further, if the trench is first formed and the via hole is then formed, a dishing phenomenon may occur in the trench region during the CMP process after the deposition of the tungsten. An over polishing may also occur. In the case of the trench region where tungsten with a high compressive characteristic is deposited, the tungsten may be peeled more easily during the CMP process.

As described above, when the polymer exists on the surface of the silicon nitride layer (SiN), the danger of the tungsten peeling phenomenon and the dishing phenomenon is increased. Consequently, defect occurs in the semiconductor device with the MIM capacitor, thus degrading the reliability of the semiconductor device.

SUMMARY OF THE INVENTION

Accordingly, the present invention is directed to a fabricating method of a semiconductor memory that substantially obviates one or more problems due to limitations and disadvantages of the related art.

An object of the present invention is to provide a fabricating method of a semiconductor device, capable of preventing the occurrence of defect in a trench region for an MIM capacitor and improving the reliability of the semiconductor device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a fabricating method of a semiconductor device, including: forming a first metal layer on a substrate and patterning the first metal layer to form a bottom metal line and a bottom electrode of a capacitor; forming an interlayer insulating layer on the resulting structure; forming a via hole in the interlayer insulating layer and forming a contact; etching the interlayer insulating layer to form a trench exposing the bottom electrode; forming a dielectric layer on the resulting structure, and removing the dielectric layer formed outside the trench; and forming a second metal layer on the resulting structure to form a top metal line and a top electrode of the capacitor.

In another aspect of the present invention, there is provided a fabricating method of a semiconductor device, including: forming a first metal layer on a substrate and patterning the first metal layer to form a bottom metal line and a bottom electrode of a capacitor; forming an interlayer insulating layer on the resulting structure; forming a via hole in the interlayer insulating layer and forming a contact; etching the interlayer insulating layer to form a trench exposing the bottom electrode; forming a dielectric layer on the resulting structure, and exposing the interlayer insulating layer through a chemical mechanical polishing (CMP) process; and forming a second metal layer on the resulting structure to form a top metal line and a top electrode of the capacitor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2F are sectional views illustrating a method of forming an MIM capacitor according to an embodiment of the present invention.

Figure 2A:
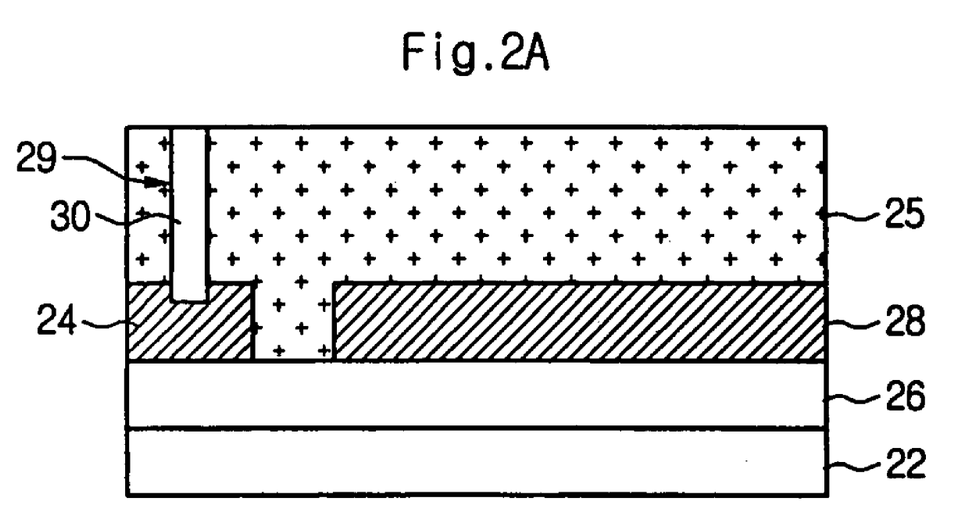
FIGS. 2A to 2F are sectional views illustrating a method of forming an MIM capacitor according to an embodiment of the present invention.

Referring to FIG. 2A, an oxide layer 26 is formed on a predetermined substrate 22. Then, a metal layer is formed on the oxide layer 26 and is patterned to form a bottom metal line 24 and a bottom electrode 28 of a capacitor. The bottom metal line 24 and the bottom electrode 28 can be formed of aluminum (Al) having good conductivity.

Next, an interlayer insulating layer 25 is formed on the resulting structure, and a via hole 29 is formed to expose the bottom metal line 24. A contact 30 connecting to the bottom metal line 24 is formed by depositing a metal. For example, the contact 30 can be formed of tungsten (W) using a CVD process.

Although not shown, the tungsten (W) is deposited on the interlayer insulating layer 25 as well as the contact 30. The tungsten (W) deposited on the interlayer insulating layer 25 can be removed using a CMP process. Like this, the tungsten (W) formed on the interlayer insulating layer 25 is removed by the CMP to thereby provide a planarized stack structure.

Figure 2B:
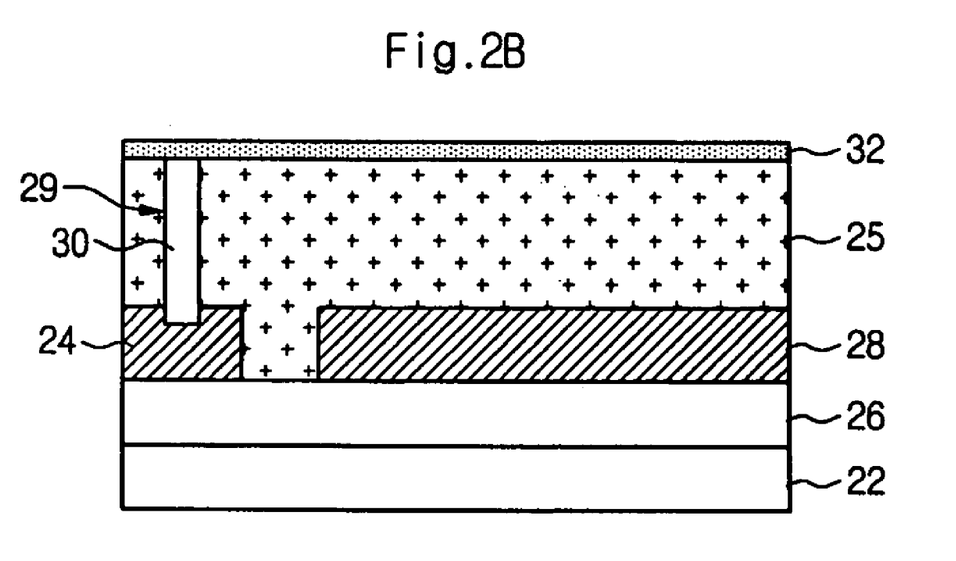
Figure 2C:
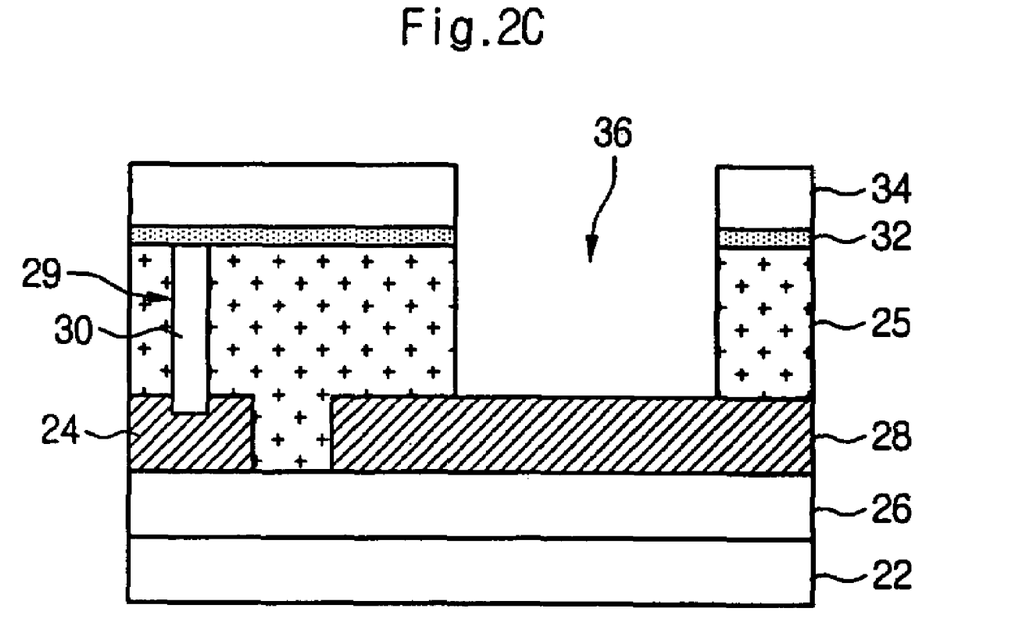

Referring to FIG. 2B, a titanium nitride (TiN) layer 32 is formed on the planarized structure. The titanium nitride (TiN) layer 32 protects the contact 30 formed of tungsten (W).

Then, a first photoresist layer 34 is formed on the titanium nitride layer 32 and is patterned. Then, an etching process is carried out to form a stack structure illustrated in FIG. 2C. Through the etching process, a trench 36 for the capacitor is formed in the interlayer insulating layer 25.

Figure 2D:
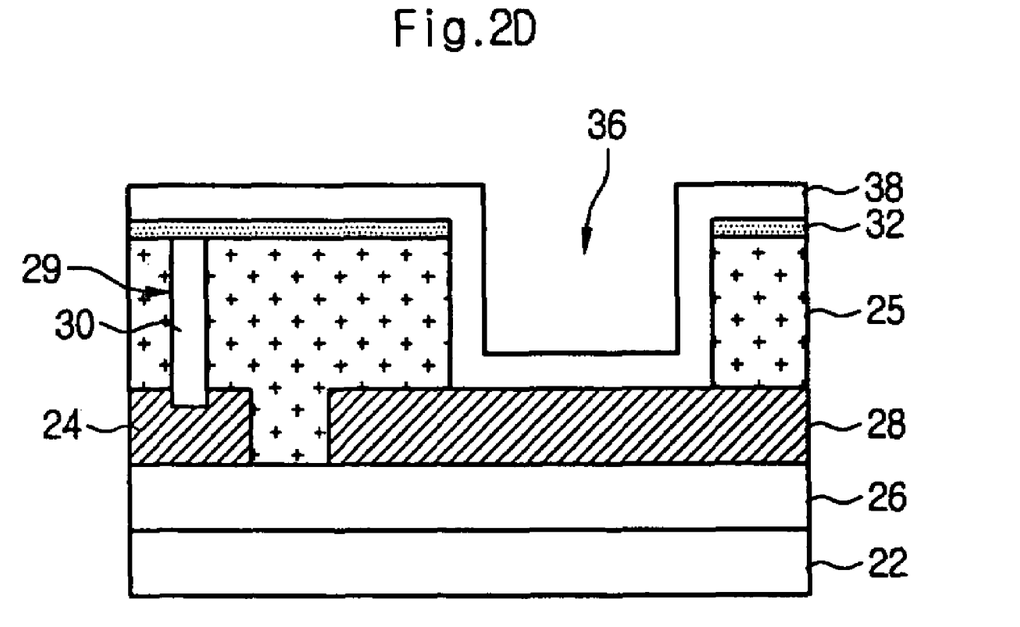

Referring to FIG. 2D, the first photoresist layer 34 is removed and a dielectric layer 38 is formed. The dielectric layer 38 may be formed of silicon nitride (SiN). At this point, in order to improve the characteristics of the dielectric layer 38, the silicon nitride (SiN) can be deposited using a plasma enhanced chemical vapor deposition (PECVD) having good filling performance.

Figure 2E:
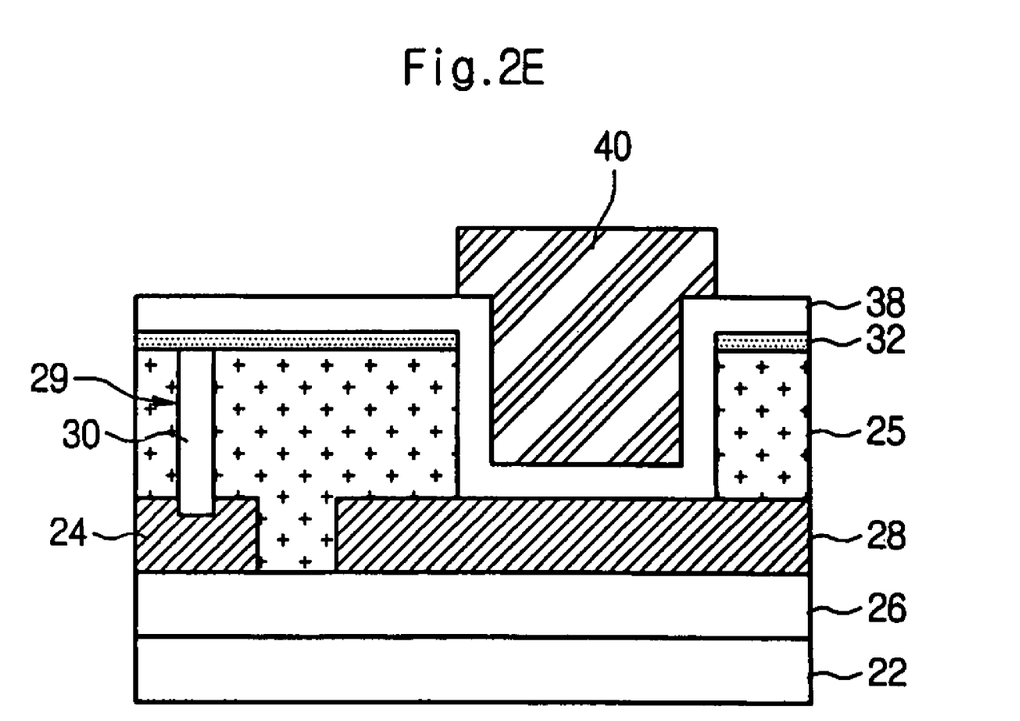

Referring to FIG. 2E, a second photoresist layer 40 is formed on the dielectric layer 38 and is patterned. In patterning the second photoresist layer 40, a photolithography process can be carried out using the mask that has been used to form the first photoresist layer 34. For example, if the first photoresist layer 34 and the second photoresist layer 40 are formed of a positive photoresist material and a negative photoresist material, respectively, the photolithography processes can be carried out using the same mask. Also, if the first photoresist layer 34 and the second photoresist layer 40 are formed of a negative photoresist material and a positive photoresist material, respectively, the photolithography processes can be carried out using the same mask.

An etching process is carried out on the resulting structure to thereby remove the dielectric layer 38 and the titanium nitride (TiN) layer 32, which are formed in a region where the second photoresist layer 40 is not formed. Then, a metal layer 42 for a top metal line and a top electrode of the MIM capacitor is formed. The metal layer 42 may be formed of aluminum (Al) with good conductivity.

Figure 2F:
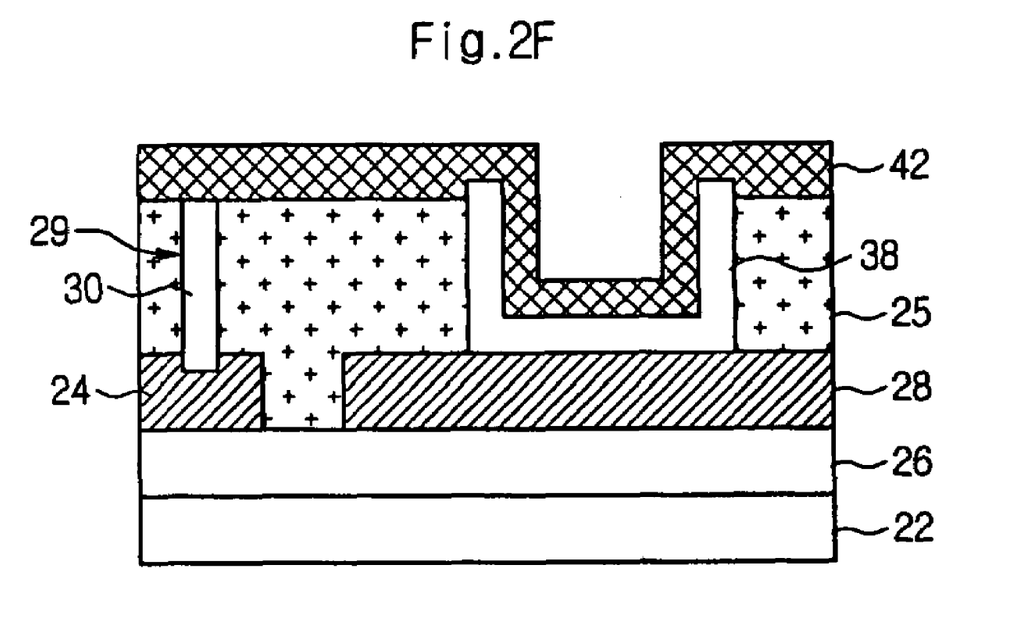

As a result, a stack structure is formed as illustrated in FIG. 2F. That is, the MIM capacitor having the bottom electrode 28, the dielectric layer 38, and the metal layer 42 can be formed in the trench region 36.

The MIM capacitor according to the embodiment of the present invention can fundamentally solve the above-described problems of the related art. According to the present invention, as illustrated in FIG. 2F, a tungsten (W) layer is not included when the MIM capacitor is formed in the trench region 36.

Also, the metal layer 42 acting as the top electrode of the capacitor can be formed just above the dielectric layer 38 (e.g., the silicon nitride (SiN) layer) inside the trench 36. Therefore, the tungsten peeling phenomenon in the trench 36 can be fundamentally prevented.

Figure 3:
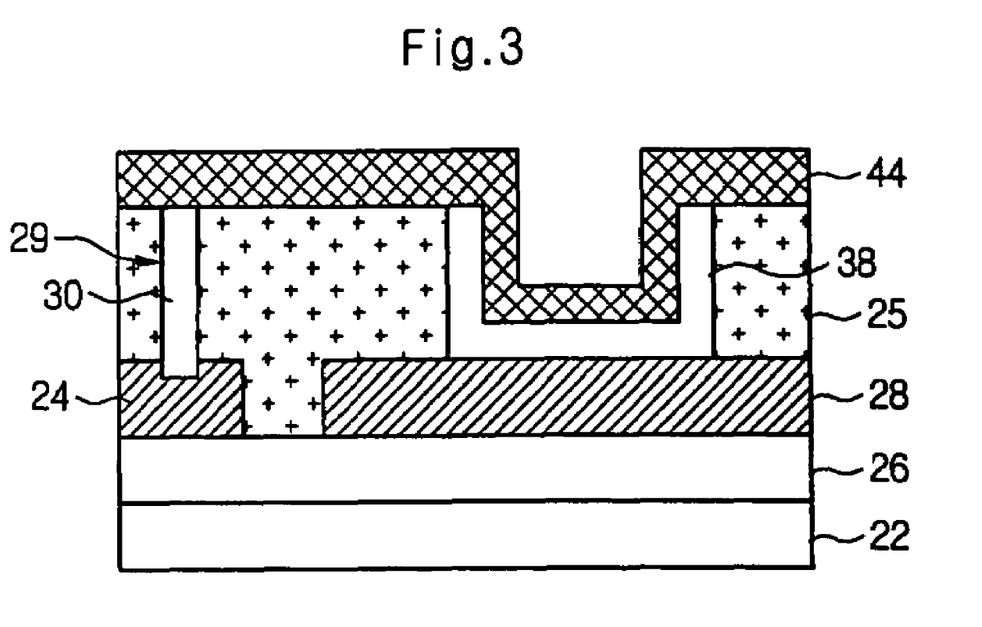
FIG. 3 is a sectional view illustrating a method of forming an MIM capacitor according to another embodiment of the present invention.

FIG. 3 is a sectional view illustrating a method of forming an MIM capacitor according to another embodiment of the present invention.

The MIM capacitor of FIG. 3 undergoes the processes described above with reference to FIGS. 2A to 2D. However, a CMP process is carried out in a state in which the stack structure is formed as illustrated in FIG. 2D.

A planarization process is carried out through a CMP process to thereby expose the interlayer insulating layer 25. A metal layer 44 for the top electrode of the MIM capacitor is formed. The metal layer 44 may be formed of aluminum (Al) with good conductivity.

As a result, a stack structure is formed as illustrated in FIG. 3. That is, the MIM capacitor having the bottom electrode 28, the dielectric layer 38, and the metal layer 44 can be formed in the trench region 36.

The MIM capacitor according to the another embodiment of the present invention can fundamentally solve the above-described problems of the related art. According to the present invention, as illustrated in FIG. 3, a tungsten (W) layer is not included when the MIM capacitor is formed in the trench region 36.

Also, the metal layer 44 acting as the top electrode of the capacitor can be formed just above the dielectric layer 38 (e.g., the silicon nitride (SiN) layer) inside the trench 36. Therefore, the tungsten peeling phenomenon in the trench 36 can be fundamentally prevented.

Consequently, the present invention can prevent the occurrence of defect in the trench region for the MIM capacitor and improve the reliability of the semiconductor device.

It will be apparent to those skilled in the art that various modifications and variations can be made in the present invention. Thus, it is intended that the present invention covers the modifications and variations of this invention provided they come within the scope of the appended claims and their equivalent.

What is claimed is:

1. A fabricating method of a semiconductor device, comprising:
    forming a first metal layer on a substrate and patterning the first metal layer to form a bottom metal line and a bottom electrode of a capacitor;
    forming an interlayer insulating layer on the resulting structure;
    forming a via hole in the interlayer insulating layer;
    forming a contact by depositing a metal for connecting to the bottom metal line;
    after forming the contact, exposing the interlayer insulating layer through planarization using a chemical mechanical polishing (CMP) process;
    forming a titanium nitride (TiN) layer on the resulting structure after the CMP process;
    etching the titanium nitride layer and the interlayer insulating layer to form a trench exposing the bottom electrode;
    forming a dielectric layer on the resulting structure, and exposing the interlayer insulating layer through a chemical mechanical polishing (CMP) process; and
    forming a second metal layer on the resulting structure to form a top metal line and a top electrode of the capacitor.

2. The fabricating method according to claim 1, wherein the first metal layer and the second metal layer are formed of aluminum (Al).

3. The fabricating method according to claim 1, wherein the via hole formed in the interlayer insulating layer exposes the bottom metal line.

4. The fabricating method according to claim 1, wherein the contact is formed of tungsten (W).

5. The fabricating method according to claim 1, wherein the dielectric layer is formed of a silicon nitride (SiN) layer.

6. The fabricating method according to claim 5, wherein the silicon nitride (SiN) layer is formed using a plasma enhanced chemical vapor deposition (PECVD).

* * * * *